United States Patent [19]

Yu

[11] Patent Number: 5,786,717

[45] Date of Patent: Jul. 28, 1998

[54] SYSTEM RESET DEVICE HAVING LEVEL CONTROLLER FOR OPPORTUNELY SETTING SYSTEM RESET STATUS

[75] Inventor: Kuo Cheng Yu, Hsinchu, Taiwan

[73] Assignee: Holtek Microelectronics Inc., Hsinchu, Taiwan

[21] Appl. No.: 881,909

[22] Filed: Jun. 25, 1997

Related U.S. Application Data

[63] Continuation-in-part of Ser. No. 577,872, Dec. 22, 1995, abandoned.

[51] Int. Cl.$^6$ ........................................... H03K 17/22
[52] U.S. Cl. ........................................... 327/143; 327/198
[58] Field of Search ........................................... 327/142, 143, 327/198-200, 217

[56] References Cited

U.S. PATENT DOCUMENTS 4,716,322 12/1987 D'Arrigo et al. ........................... 327/143

5,629,642 5/1997 Yoshimura ........................... 327/143

*Primary Examiner*—Kenneth B. Wells
*Attorney, Agent, or Firm*—Lackenbach Siegel Marzullo Aronson & Greenspan, P.C.

[57] ABSTRACT

The present invention is related to a system reset device setting the reset status of a system in response to a reset signal. The system reset device according to the present invention includes a power-stability detecting circuit for detecting the stability of a power signal generated by a power source and provided for the system, an oscillation-stability detecting circuit for detecting the stability of an oscillation signal generated by an oscillator and provided for the system, and a level-control circuit electrically connected to the power-stability detecting circuit and the oscillation-stability detecting circuit for controlling a level state of the rest signal in response to the stability of the power signal and the oscillation signal. The level-control circuit includes an OR gate, an AND gate, and an S-R latch for performing the level state control of the reset signal.

10 Claims, 1 Drawing Sheet

SYSTEM RESET DEVICE HAVING LEVEL CONTROLLER FOR OPPORTUNELY SETTING SYSTEM RESET STATUS

This is a continuation-in-part of application Ser. No. 08/577,874, filed Dec. 22, 1995, now abandoned.

FIELD OF THE INVENTION

The present invention is a continuation-in-part application of the parent application bearing Ser. No. 08/577,874 and filed on Dec. 22, 1995. The present invention is generally related to a device for setting the status of a system, and more particularly to a device for opportunely setting a system reset status.

BACKGROUND OF THE INVENTION

In a conventional electronic system, whether a reset system has stabilized or not is concluded according to the level state of a pulse-mode system reset signal generated at the time the system is reset. While the system is considered unstable when the reset signal remains in a high level state, the system is considered stable to be ready for operation when the reset signal proceeds to a low level state. In detail, however, the stability of the system can be affected by several operating factors which are expounded explicitly hereinafter.

Stability of Power Voltage: The voltage of the power source of a system is generally fluctuating and unstable when the system is initialized. The voltage fluctuation is generally responsible for the operational errors of the system. In other words, if the level state of the reset signal has changed from high to low to finish the resetting operation and actuate the system to work before the power voltage has stabilized, operational errors would occur.

Completion of Initial Value Setting: Various operations of a system are controlled by system programs which are executed according to the initial values set upon the initialization of the system as reference values. The setting of the initial values has to be completed before the system starts to work normally. If the setting operation of the initial values has not finished at the time the reset signal turns from a high level state into a low level state, erroneous initial values will be obtained so as to adversely affect the following operations.

Stability of Frequency of System Oscillator: The system oscillator starts oscillating upon the system being powered on. At the beginning, the oscillating signal is generally beyond desired full amplitude. The frequency of the oscillator during the onset period is generally higher than that required during the normal work period. If the oscillation frequency has not stabilized at the time the reset signal turns from a high level state into a low level state, the overhigh frequency will interfere with the following work of the system.

Immunity from Power Noise: During the onset period of a system, there usually are noises disorderly mixed with the power signal. If the noises do not subside before the end of the system reset status, the system cannot work normally.

Therefore, the system cannot operate well if any one of the above factors does not comply with the requirement. Such a problem is more readily apparent for a microprocessor which operates in response to built-in programs thereof. If any of the system parameters has not stabilized but the built-in programs have been executed, errors will be subject to occur in the microprocessor.

For such a system that makes no effort to trace the stability of the system parameters, the only way to avoid operational errors is to delay the switching moment of the reset signal from the high level state to the low level state. Accordingly, the response time of the system is likely to improperly extended.

SUMMARY OF THE INVENTION

An object of the present invention is to provide a system reset device, which stops the reset status of a system only after the power signal and the oscillation signal have stabilized.

Another object of the present invention is to provide a system reset device which keeps the reset signal outputted therefrom in high level state until the variations of the power signal and the oscillation signal are within an acceptable range.

According to the present invention, a system reset device setting the reset status of a system in response to a reset signal includes a power-stability detecting circuit for detecting the stability of a power signal generated by a power source and provided for the system; an oscillation-stability detecting circuit for detecting the stability of an oscillation signal generated by an oscillator and provided for the system; and a level-control circuit electrically connected to the power-stability detecting circuit and the oscillation-stability detecting circuit for controlling a level state of the rest signal in response to the stability of the power signal and the oscillation signal. The level-control circuit includes an OR gate having input terminals for receiving the reset signal and a first output of the power-stability detecting circuit, and thereby generating an OR-gate output; an AND gate having input terminals for receiving a second output of the power-stability detecting circuit and an output of the oscillation-stability detecting circuit, and thereby generating an AND-gate output; and an S-R latch circuit electrically connected with the OR gate and the AND gate, and controlling the level state of the rest signal in response to the OR-gate output and the AND-gate output.

The power signal can be considered unstable if a voltage of the power signal is detected below a predetermined value, and alternatively, if a voltage variation of the power signal is detected beyond a predetermined range. The detection of the power stability can be performed by a voltage-detecting unit included in the power-stability detecting circuit and electrically connected between the power source and the level-control circuit, and the voltage-detecting unit will output a high level state of the first output to the OR gate when the voltage is below the predetermined value and/or the voltage variation is beyond the predetermined range.

In accordance with another aspect of the present invention, the power-stability detecting circuit preferably further includes a delay circuit electrically connected between the voltage-detecting unit and the level-control circuit. The delay circuit in this preferred embodiment is triggered by the voltage-detecting unit to be cleared when the voltage of the power signal is below the predetermined value and/or the voltage variation of the power signal is beyond the predetermined range, and outputs a high level state of the second output to the AND gate when the delay circuit is no longer triggered to be cleared during a predetermined time period.

Preferably, the oscillation-stability detecting circuit includes a Schmitt trigger electrically connected to the oscillator for filtering the oscillation signal so as to immunize the oscillation signal against noises of small amplitudes; and a frequency divider electrically connected between the Schmitt trigger and the level-control circuit for dividing frequency of the filtered oscillation signal so as to amplify and stabilize the filtered oscillation signal and transmitting the frequency-divided oscillation signal to the AND gate.

In another preferred embodiment, the oscillation-stability detecting circuit is electrically connected to and triggered by the delay circuit to detect the stability of the oscillation signal after the high level state of the second output has been outputted the delay circuit.

The predetermined value mentioned above is generally an operational threshold voltage value.

BRIEF DESCRIPTION OF THE DRAWING

The present invention may best be understood through the following description with reference to the accompanying drawings, in which.

DETAILED DESCRIPTION OF THE PREFERRED EMBODIMENT

Figure 1:
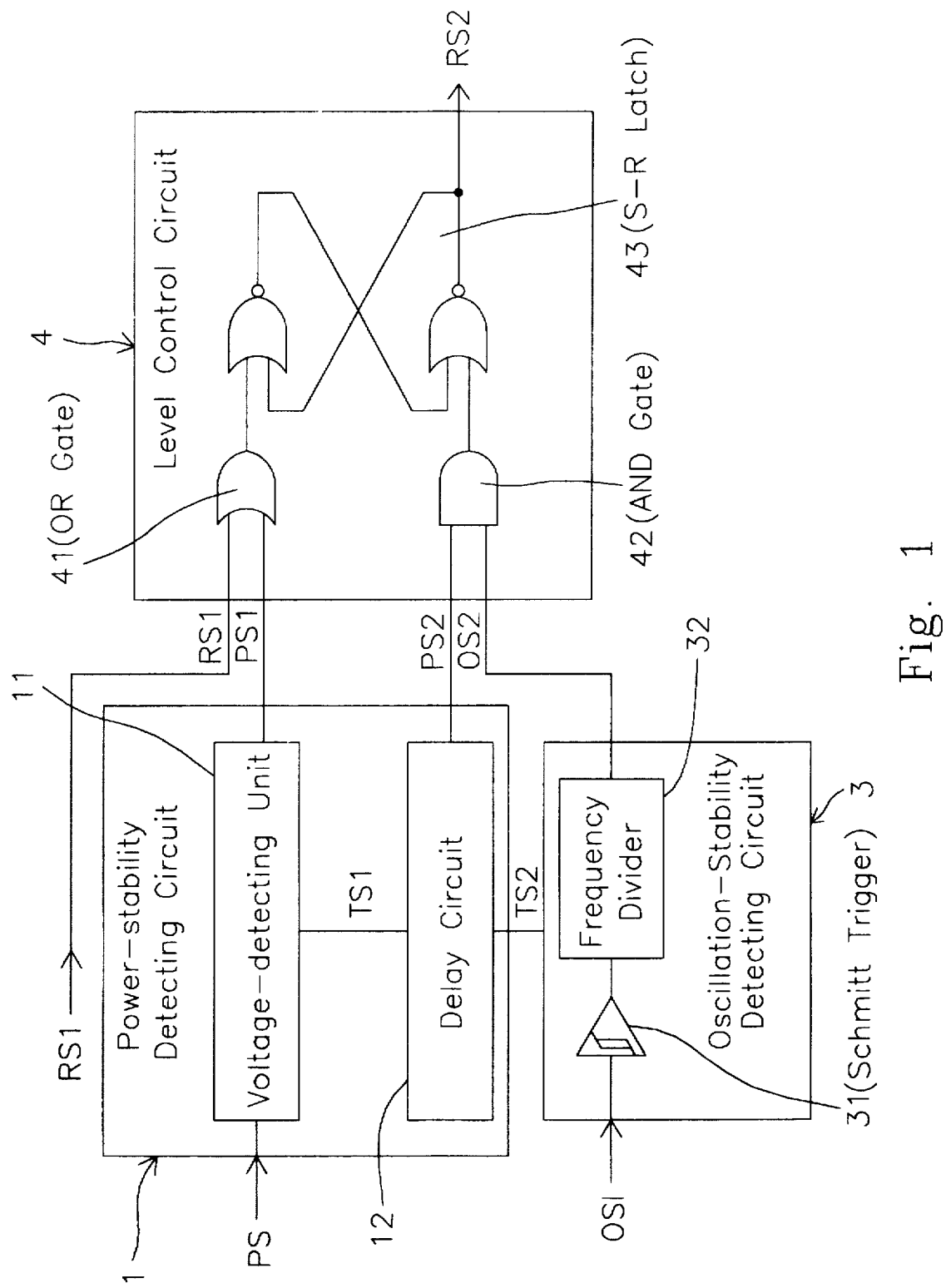
FIG. 1 is a schematic block diagram showing a preferred embodiment of a system reset device according to the present invention.

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Please refer to FIG. 1 which schematically shows a preferred embodiment of a system reset device according to the present invention. The system reset device shown in FIG. 1 includes a power-stability detecting circuit 1 for detecting the stability of a power signal PS generated by a power source (not shown), an oscillation-stability detecting circuit 3 for detecting the stability of an oscillation signal OS1 generated by an oscillator (not shown), and a level-control circuit 4 electrically connected to the power-stability detecting circuit 1 and the oscillation-stability detecting circuit 3 for controlling a level state of the rest signal RS1 in response to the stability of the power signal PS and the oscillation signal OS1.

The power-stability detecting circuit 1 includes a voltage-detecting unit 11 for detecting a voltage and/or a voltage variation of the power signal PS, and a delay circuit 12 for assuring that the voltage and/or the voltage variation of power signal have been kept within a satisfying level range for a predetermined time period. The level control circuit 4 includes an OR gate 41, an AND gate 42 and an S-R latch 43 for performing logic operations of concerning signals in order to control the level state of the outputted reset signal RS2. If the voltage of the power signal PS is below a predetermined value, i.e. the IC operational threshold voltage, or the voltage variation of the power signal PS is beyond a predetermined range, i.e. an acceptable voltage range which will not result in operational errors, the output PS1 of the voltage-detecting unit 11 will be kept in a high level state so that the outputted reset signal RS2 through the OR gate 41 and the S-R latch 43 will be kept in a high level state. In other words, the system is maintained in a reset status if the voltage of the power signal is too low and/or the voltage variation of the power signal is too large.

Upon sending out the high-level-state output signal PS1, the voltage-detecting unit 11 sends out a signal TS1 to clear the delay circuit 12 and enable the delay circuit 12 to start tuning. If the signal PS1 has turned into a low level state and then turned into a high level state again, the delay circuit 12 will be cleared again and restart timing. After the signal PS1 has been kept at a low level state for a certain time period so that the timing of the delay circuit 11 has achieved a certain value, the delay circuit 12 outputs a high-level-state signal PS2 to the level control circuit 4.

Upon sending out the high-level-state signal PS2, the delay circuit 12 sends out a signal TS2 to trigger the oscillation-stability detecting circuit 3 to output a detecting signal OS2 to indicate whether the oscillation signal OS1 has stabilized. The oscillation-stability detecting circuit 3 includes a Schmitt trigger 31 and a frequency divider 32. The oscillation signal OS1 is inputted to the Schmitt trigger 31 to be filtered out noises of small amplitudes. The filtered oscillation signal is then inputted into the frequency divider 32 to be divided so as to be amplified and stabilized. The oscillation signal OS1 is accordingly delayed through the frequency divider 32, and a high-level-state signal OS2 is outputted to the level control circuit 4 only after the oscillation signal OS1 has stabilized. It is to be noted that although the oscillation-stability detecting circuit 3 is actuated by the delay circuit 12 in this preferred embodiment, the oscillation-stability detecting circuit 3 can also be independent from the delay circuit 12 and can be triggered to output the signal OS2 in another way.

To encompass all, in this preferred embodiment, the outputted reset signal RS2 will be in a low level state to complete the reset of the system only when the inputted reset signal RS1 has turned into a low level state, the voltage-detecting unit has outputted a low-level-state signal PS1, the delay circuit 12 has outputted a high-level-state signal PS2, and the oscillation-stability detecting circuit has outputted a high-level-state signal OS2. The specified states of these signals cause the low level state of the signal RS2 due to the arrangement of the OR gate 41, the AND gate 42 and the S-R latch 43.

Of course, it can be designed that if the power signal PS becomes unstable after the reset of the system has completed, the high-level-state signal PS1 can be inputted to the level control circuit 4 to have the signal RS2 turn into high level state to reset the system again.

To sum up, the present system reset device uses a power-stability detecting circuit and a oscillation-stability detecting circuit to detect whether the system has stabilized, and preferably uses a delay circuit for further assurance. In addition, a level-control circuit is used in the present invention to control a level state of the rest signal. Owing to the level-control circuit, the reset signal will not turn into a low level state to complete the reset status of the system until the system has stabilized. By this way, the operational errors resulting from unstable power and unstable oscillation can be avoided or minimized.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A system reset device setting the reset status of a system in response to a reset signal, comprising:

a power-stability detecting circuit for detecting the stability of a power signal generated by a power source and provided for said system;

an oscillation-stability detecting circuit for detecting the stability of an oscillation signal generated by an oscillator and provided for said system; and a level-control circuit electrically connected to said power-stability detecting circuit and said oscillation-stability detecting circuit for controlling a level state of said rest signal in response to the stability of said power signal and said oscillation signal, and said level-control circuit including:

an OR gate having input terminals for receiving said reset signal and a first output of said power-stability detecting circuit, and thereby generating an OR-gate output;

an AND gate having input terminals for receiving a second output of said power-stability detecting circuit and an output of said oscillation-stability detecting circuit, and thereby generating an AND-gate output; and an S-R latch circuit electrically connected with said OR gate and said AND gate, and controlling said level state of said rest signal in response to said OR-gate output and said AND-gate output.

2. The system reset device according to claim 1 wherein said power-stability detecting circuit includes a voltage-detecting unit electrically connected between said power source and said level-control circuit for detecting whether a voltage of said power signal is below a predetermined value, and outputting a high level state of said first output to said OR gate when said voltage is below said predetermined value.

3. The system reset device according to claim 2 wherein said power-stability detecting circuit further includes a delay circuit electrically connected between said voltage-detecting unit and said level-control circuit, said delay circuit being triggered by said voltage-detecting unit to be cleared when said voltage of said power signal is below said predetermined value, and outputting a high level state of said second output to said AND gate when said delay circuit is no longer triggered to be cleared during a predetermined time period.

4. The system reset device according to claim 3, wherein said oscillation-stability detecting circuit comprises:

a Schmitt trigger electrically connected to said oscillator for filtering said oscillation signal so as to immunize said oscillation signal against noises of small amplitudes; and a frequency divider electrically connected between said Schmitt trigger and said level-control circuit for dividing frequency of said filtered oscillation signal so as to amplify and stabilize said filtered oscillation signal and transmitting said frequency-divided oscillation signal to said AND gate.

5. The system reset device according to claim 4 wherein said oscillation-stability detecting circuit is electrically connected to and triggered by said delay circuit to detect the stability of said oscillation signal after said high level state of said second output has been outputted from said delay circuit.

6. The system reset device according to claim 5 wherein said predetermined value is an operational threshold voltage value.

7. The system reset device according to claim 1 wherein said power-stability detecting circuit includes a voltage-detecting unit electrically connected between said power source and said level-control circuit for detecting whether a voltage variation of said power signal is within a predetermined range, and outputting a high level state of said first output to said OR gate when said voltage variation is beyond said predetermined value.

8. The system reset device according to claim 7 wherein said power-stability detecting circuit further includes a delay circuit electrically connected between said voltage-detecting unit and said level-control circuit, said delay circuit being triggered by said voltage-detecting unit to be cleared when said voltage variation of said power signal is beyond said predetermined range, and outputting a high level state of said second output to said AND gate when said delay circuit is no longer triggered to be cleared during a predetermined time period.

9. The system reset device according to claim 8, wherein said oscillation-stability detecting circuit comprises:

a Schmitt trigger electrically connected to said oscillator for filtering said oscillation signal so as to immunize said oscillation signal against noises of small amplitudes; and a frequency divider electrically connected between said Schmitt trigger and said level-control circuit for dividing frequency of said filtered oscillation signal so as to amplify and stabilize said filtered oscillation signal and transmitting said frequency-divided oscillation signal to said AND gate.

10. The system reset device according to claim 9 wherein said oscillation-stability detecting circuit is electrically connected to and triggered by said delay circuit to detect the stability of said oscillation signal after said high level state of said second output has been outputted from said delay circuit.

* * * * *